(12) United States Patent
Bhattacharyya

(10) Patent No.: US 7,482,651 B2
(45) Date of Patent: Jan. 27, 2009

(54) ENHANCED MULTI-BIT NON-VOLATILE MEMORY DEVICE WITH RESONANT TUNNEL BARRIER

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/298,884

(22) Filed: Dec. 9, 2005

(65) Prior Publication Data

US 2007/0132010 A1 Jun. 14, 2007

(51) Int. Cl.
*H01L 29/788* (2006.01)

(52) U.S. Cl. .............. 257/314; 257/315; 257/321; 257/324; 257/325; 257/E29.304; 257/E29.309

(58) Field of Classification Search .......... 257/314, 257/315, 321, 324, 325, 390, E27.102, E29.132, 257/E29.192, E29.304, E29.309, E29.316, 257/E21.21, E21.423, E21.679

See application file for complete search history.

(56) References Cited

U.S. PATENT DOCUMENTS

| 6,407,435 B1* | 6/2002 | Ma et al. ............... 257/411 |
| 6,562,491 B1* | 5/2003 | Jeon ............... 428/697 |
| 6,617,639 B1 | 9/2003 | Wang et al. |
| 6,882,592 B2 | 4/2005 | Noguchi et al. |
| 6,917,072 B2 | 7/2005 | Noguchi et al. |
| 2003/0080370 A1* | 5/2003 | Harari et al. ............... 257/314 |
| 2003/0132432 A1 | 7/2003 | Yoshii et al. |
| 2004/0169238 A1* | 9/2004 | Lee et al. ............... 257/406 |
| 2005/0051856 A1* | 3/2005 | Ono et al. ............... 257/411 |
| 2006/0197227 A1* | 9/2006 | Liang et al. ............... 257/761 |

OTHER PUBLICATIONS

T.C. Chang, et al., "Quasisuperlattice storage: A concept of multi-level charge storage," Applied Physics Letters, vol. 85, No. 2, American Institute of Physics, Jul. 14, 2004, pp. 248-250.
S. Kim, et al., "Robust Multi-bit Programmable Flash Memory Using a Resonant Tunnel Barrier," Process Development Team, Memory Division, Semiconductor Business, Samsung Electronics Co., Ltd., No. 257.

* cited by examiner

*Primary Examiner*—Minh-Loan T Tran
*Assistant Examiner*—Leslie Pilar Cruz
(74) *Attorney, Agent, or Firm*—Leffert Jay & Polglaze, P.A.

(57) ABSTRACT

A non-volatile memory cell uses a resonant tunnel barrier that has an amorphous silicon and/or amorphous germanium layer between two layers of either HfSiON or $LaAlO_3$. A charge trapping layer is formed over the tunnel barrier. A high-k charge blocking layer is formed over the charge trapping layer. A control gate is formed over the charge blocking layer. Another embodiment forms a floating gate over the tunnel barrier that is comprised of two oxide layers with an amorphous layer of silicon and/or germanium between the oxide layers.

23 Claims, 9 Drawing Sheets

ENHANCED MULTI-BIT NON-VOLATILE MEMORY DEVICE WITH RESONANT TUNNEL BARRIER

TECHNICAL FIELD OF THE INVENTION

The present invention relates generally to memory devices and in particular the present invention relates to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), non-volatile, floating gate NOR/NAND flash memory, and dynamic random access memory (DRAM).

Flash memories may use floating gate technology or trapping technology. Floating gate cells include source and drain regions that may be laterally spaced apart to form an intermediate channel region. The source and drain regions are formed in a common horizontal plane of a silicon substrate. The floating gate, typically made of doped polysilicon, is disposed over the channel region and is electrically isolated from the other cell elements by oxide. The non-volatile memory function for the floating gate technology is created by the absence or presence of charge stored on the isolated floating gate. The floating gate cell may be a single level cell (SLC) or a multiple level cell (MLC).

The trapping technology functions as a non-volatile memory and can be implemented in a silicon-oxide-nitride-oxide-silicon (SONOS) architecture as illustrated in FIG. 1. The nitride trap layer can capture and store electrons or holes in order to act as a non-volatile memory. The cell may be an SLC or an MLC.

Each cell's threshold voltage ($V_{th}$) determines the data that is stored in the cell. For example, in a single bit per cell, a $V_{th}$ of 0.5V might indicate a programmed cell while a $V_{th}$ of −0.5V might indicate an erased cell. The multilevel cell may have multiple $V_{th}$ windows that each indicate a different state. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell and the stability of the assigned voltage ranges during the lifetime operation of the memory cell.

For example, a cell may be assigned four different voltage ranges of 200 mV for each range. Typically, a dead space or margin of 0.2V to 0.4V is between each range. If the voltage stored on the cell is within the first range, the cell is storing a 00. If the voltage is within the second range, the cell is storing a 01. This continues for as many ranges that are used for the cell provided these voltage ranges remain stable during the lifetime operation of the memory cell.

MLC requires tight control of the threshold voltage ranges and stability of these voltage ranges in order to achieve multiple memory states and associated ranges of threshold levels per cell. For a conventional floating gate or SONOS flash memory cell, the spread in the threshold level (when programmed by a defined set of conditions) of the memory state is affected by several factors. The key factors are: (a) the statistical variations of tunnel oxide thickness and cell coupling coefficient from cell-to-cell; (b) the variation of the trapped charge centroid in density and depth; (c) cell-to-cell variation in trapped charge losses during stand-by (retention), during reading (read disturb), during partial programming (inhibit) and; (d) cell-to-cell variation in endurance (write/erase cycling) characteristics. Additionally, variations in capacitance coupling between adjacent cells creates variation in program disturb differently from cell-to-cell and contribute to the threshold spread.

The above-mentioned factors are critical not only to SLC cell design but considerably more so for the MLC cell design. This is due to the fact that for the flash cell design, the number of well defined logic states to be created within the available programming window (taking all possible $V_t$ spread into consideration) is given by $2^n$, where n is the number of stored memory bits per cell. For SLC, n=1; for MLC, n=2 (2 bits storage per cell) requires four logic states, and for n=3 (3 bits per cell), eight stable logic states are required within the available programming window. Conventional MLC floating gate and flash memory cells are not voltage scalable since these cells employ $SiO_2$ as the tunneling and charge blocking media which has a dielectric constant of 3.9.

One way to reduce the threshold voltage dispersion is to use a resonant tunnel barrier transistor as illustrated in FIG. 2. Such a transistor is comprised of a normal SiN trapping layer 201, a $SiO_2$ charge blocking layer 202, and a polysilicon gate 203. However, the tunnel dielectric 200 is comprised of a layer of $SiO_2$ 210, a layer of amorphous silicon 211, and another layer of $SiO_2$ 212. This results in an electron band energy level diagram as illustrated in FIG. 3.

FIG. 3 shows the electron band for the tunnel dielectric 320 that is comprised of the first $SiO_2$ layer 307, the amorphous silicon layer 306, and the second $SiO_2$ layer 305. The electron bands for the SiN trapping layer 304, $SiO_2$ charge blocking layer 303, and gate 301 are also shown.

FIG. 4 illustrates a typical prior art threshold voltage distribution for a conventional SONOS-type structure. Each state, '00' '01' '10' and '11', is shown along the threshold voltage ($V_{th}$) axis. This diagram shows that each state has a relatively large threshold window. Such a large window might result in interference from adjacent states as well as limiting the quantity of possible states.

For example, if the '11' state has a peak point of the distribution at 4V, '10' might have a peak point at 3V, '01' might have a peak point at 2V, and '00' might have a peak distribution point of 1V. Each distribution can be +/−0.5V. Additionally, designing such a multi-level memory system requires that each state be separated from the other states by a margin. However, the margin is so small that program disturb conditions may still cause the programming of an undesired state.

FIG. 5 illustrates a typical prior art resonant tunnel barrier threshold voltage distribution. This diagram shows that each threshold voltage distribution has been substantially reduced from the prior art distributions.

The problem with the prior art materials of FIG. 2 is the lack of voltage scalability that they provide. These types of materials still require large voltages for memory cell operation.

For the reasons stated above, and for other reasons stated below that will become apparent to those skilled in the art upon reading and understanding the present specification, there is a need in the art for multiple level memory cells to achieve minimal threshold voltage dispersion in programmed states while providing highly scalable cell design.

SUMMARY

The above-mentioned problems and other problems are addressed by the present invention and will be understood by reading and studying the following specification.

The present invention encompasses a non-volatile memory cell comprising a substrate having a pair of source/drain regions. A resonant tunnel barrier is formed over the substrate and substantially between the pair of source/drain regions. The tunnel barrier preferably comprises two layers of either HfSiON or LaAlO$_3$ high-k dielectric with an amorphous layer of either silicon or germanium between the two layers. An optional embodiment may substitute one or the other above high-k layers with SiO$_2$. A charge trapping layer is formed over the resonant tunnel barrier. A high-k charge blocking layer is formed over the charge trapping layer. A gate is formed over the charge blocking layer.

Further embodiments of the invention include methods and apparatus of varying scope.

DETAILED DESCRIPTION

Figure 1:
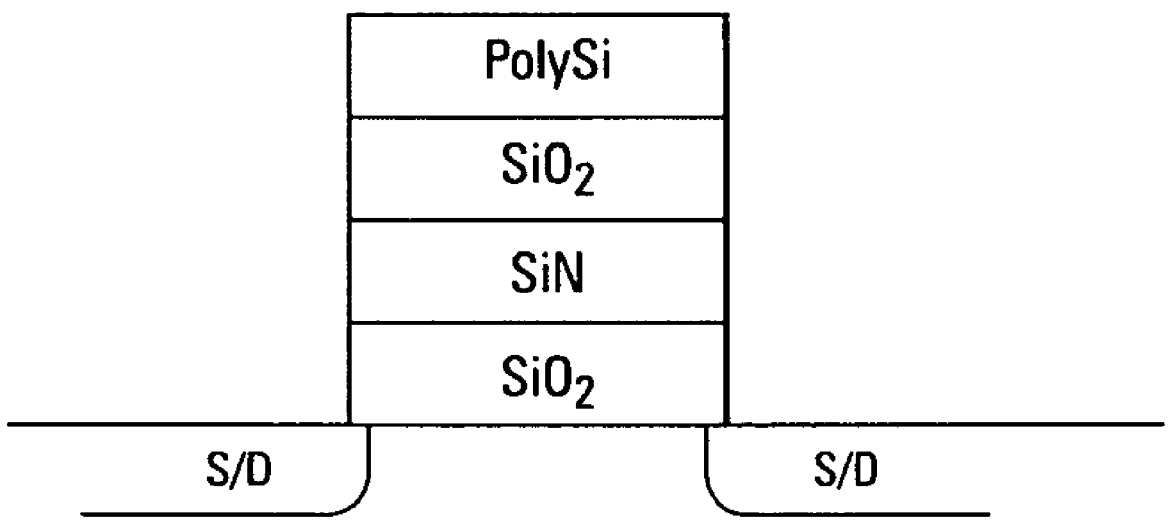
FIG. 1 shows a cross-sectional view of a typical prior art SONOS structure.
Figure 3:
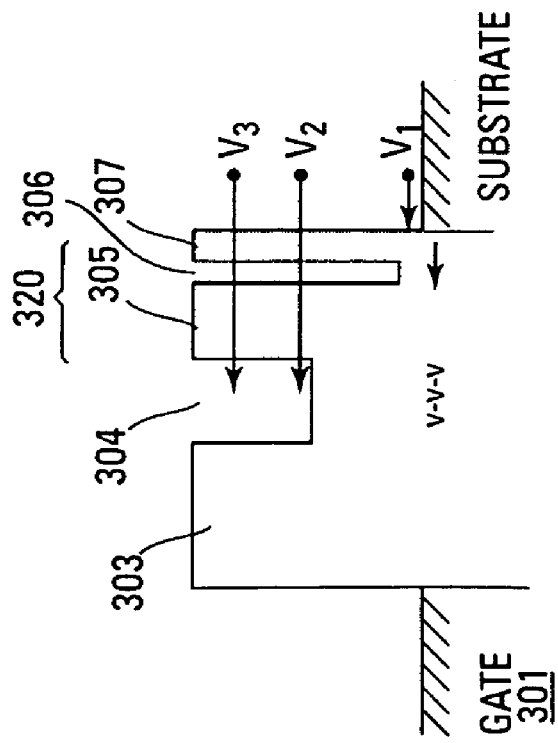
FIG. 3 shows a prior art electron band energy diagram in accordance with the prior art structure of FIG. 2.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions.

Figure 6:
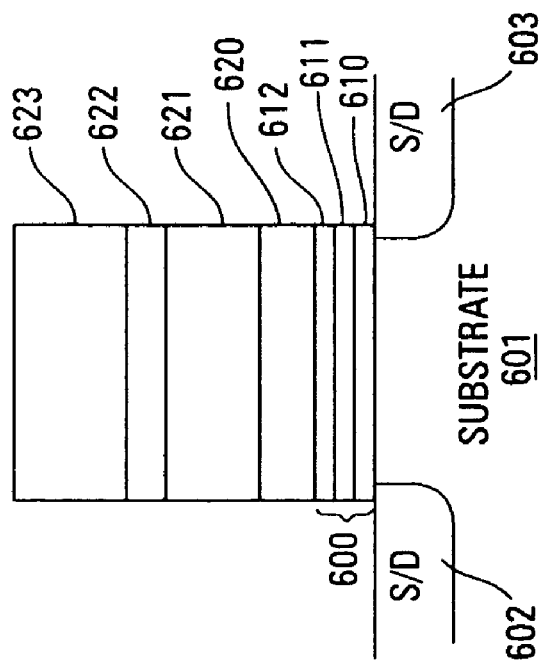
FIG. 6 shows a cross-sectional view of one embodiment of a mono-level resonant tunnel barrier floating gate transistor architecture of the present invention.

FIG. 6 illustrates a cross-sectional view of one embodiment of a floating gate memory cell of the present invention using a mono-level resonant tunnel barrier 600. The one transistor cell is formed on a substrate 601 that has doped source/drain areas 602, 603. The function of each active region 602, 603 depends on the direction of biasing of the cell.

The source/drain regions 602, 603 may be n-type regions 602, 603 doped into a p-type substrate 601. In an alternate embodiment, the source/drain regions 602, 603 are p-type regions 602, 603 doped into an n-type substrate 601.

The resonant tunnel barrier 600 is formed over the substrate 601 substantially between the pair of source/drain regions 602, 603. The tunnel barrier 600 is comprised of a single amorphous layer 611 of material between two dielectric layers 610, 612. In one embodiment, the dielectric layers 610, 612 are an oxide such as SiO$_2$.

In one embodiment, the amorphous layer 611 may be a layer of silicon (a-Si). Alternate embodiments may use germanium (a-Ge) or some other amorphous material.

Each of the layers of the resonant tunnel barrier 600 may be formed to a thickness in the range of 1-3 nm. The above materials may result in a total effective oxide thickness of the barrier 600 of approximately 3.5 nm. Alternate embodiments can use other material thicknesses.

The resonant tunnel barrier 600 provides benefits as discussed subsequently as a result of the electrons or holes having a preferred resident state after crossing the barrier at a certain energy level. In other words, under certain energy conditions, the electronic carriers have a higher probability to tunnel and once they have tunneled through the barrier, they remain in a certain well defined quantum state.

A floating gate layer 620 is formed over the resonant tunnel barrier 600. The floating gate layer 620, in one embodiment, is silicon. Alternate embodiments can use other materials.

The floating gate layer 620, in one embodiment, is formed to a thickness in the range of 3-6 nm. The floating gate material 620 usually consists of silicon as stated above with a dielectric constant of nearly 12.

A charge blocking layer 621 is formed over the floating gate layer 620. The charge blocking layer 621 prevents the leakage of the charge from the floating gate 620 to the gate 623. In one embodiment, the blocking layer 621 is comprised of HfSiON or LaAlO$_3$ and is formed to a thickness in the range of 5-10 nm. The materials used in the blocking layer 621 may provide an effective oxide thickness of approximately 1 nm.

An ultra-thin layer (e.g., 1-2 nm) of conductive metal nitride 622 may be formed over the charge blocking layer 621 and is comprised of tantalum nitride (TaN), or titanium nitride (TiN), or some other metal nitride material. This layer 622 acts as an appropriate passivation layer and diffusion barrier for undesirable impurities and dopants. The passivation layer 622 is not required for proper operation of the memory cell of the present invention.

The gate 623 is formed over the passivation layer 622 or charge blocking layer 621. The gate 623 can be comprised of heavily doped polycrystalline silicon or some other conducting material.

Figure 2:
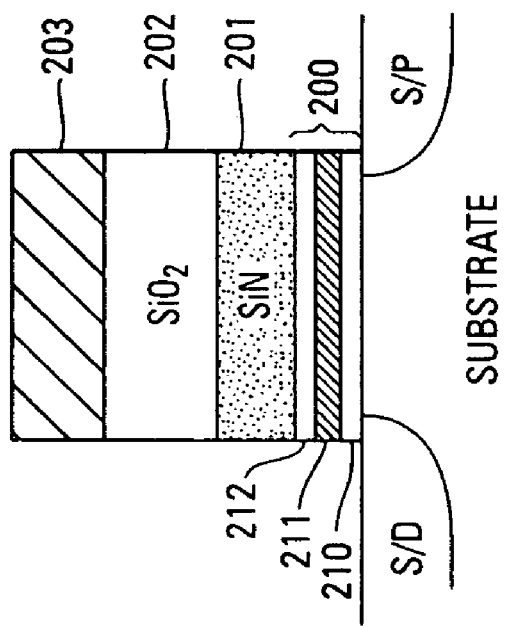
FIG. 2 shows a cross-sectional view of a typical prior art resonant tunnel barrier SONOSOS structure.
Figure 5:
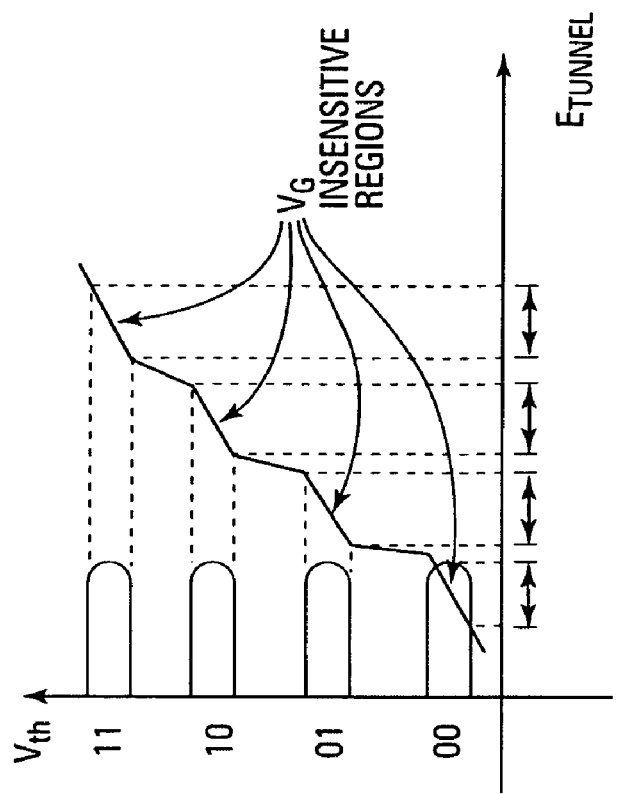
FIG. 5 shows a typical prior art threshold voltage distribution in accordance with the resonant tunnel barrier structure of FIG. 2.
Figure 4:
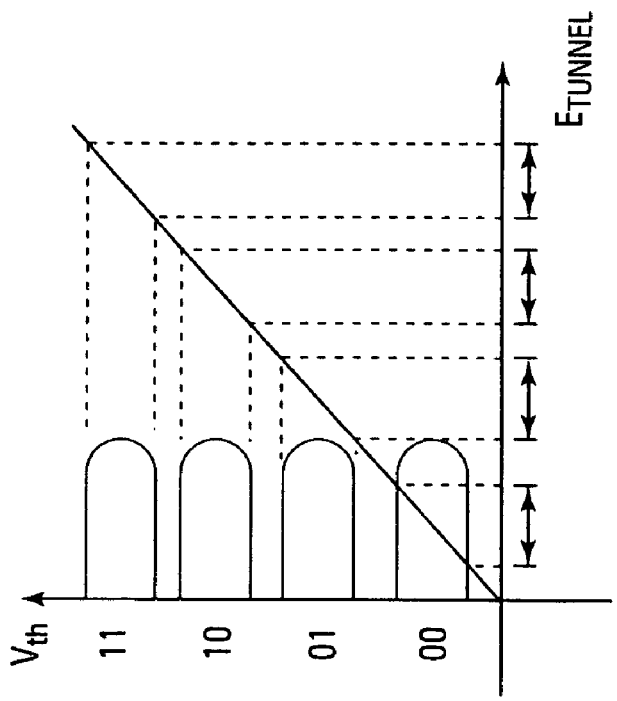
FIG. 4 shows a typical prior art threshold voltage distribution for a conventional SONOS-type structure.

The entire memory cell stack illustrated in FIG. 6, depending on chosen materials, may have an effective oxide thickness in the range of 5-6 nm compared to a stack as illustrated in FIG. 2 having an effective oxide thickness of 10-12 nm. The embodiment of FIG. 6, therefore, provides a memory cell with substantially reduced voltage requirements for programming.

Figure 7:
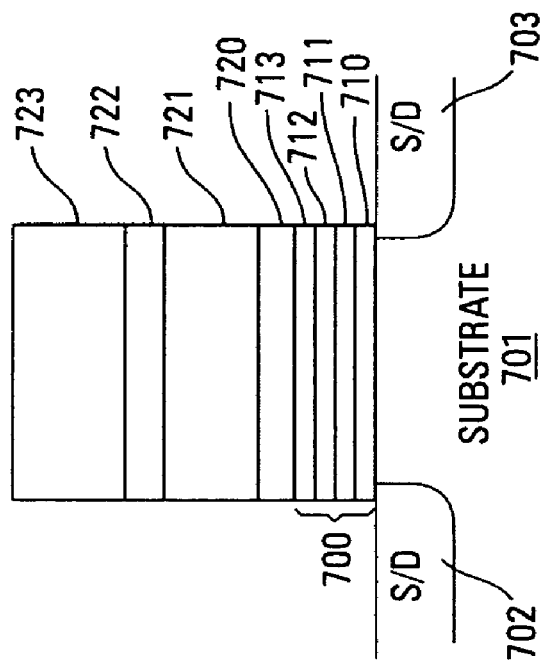
FIG. 7 shows a cross-sectional view of one embodiment of a bi-level resonant tunnel barrier floating gate transistor architecture of the present invention.

FIG. 7 illustrates a cross-sectional view of one embodiment of a floating gate memory cell of the present invention using a bi-level resonant tunnel barrier 700. The one transistor cell is formed on a substrate 701 that has doped source/drain areas 702, 703. The function of each active region 702, 703 depends on the direction of biasing of the cell.

The source/drain regions 702, 703 may be n-type regions 702, 703 doped into a p-type substrate 701. In an alternate embodiment, the source/drain regions 702, 703 are p-type regions 702, 703 doped into an n-type substrate 701.

The bi-level resonant tunnel barrier 700 is formed over the channel region of the substrate 701 substantially between the pair of source/drain regions 702, 703. The tunnel barrier 700 is comprised of a single amorphous silicon layer 712 over a single amorphous germanium layer 711 between two dielectric layers 710, 713. An alternate embodiment forms the amorphous germanium layer over the amorphous silicon layer. In one embodiment, the dielectric layers 710, 713 are an oxide such as $SiO_2$.

Each of the layers of the resonant tunnel barrier 700 may be formed to a thickness in the range of 1-3 nm. The materials result in a total effective oxide thickness of the barrier 700 of approximately 3.5 nm. Alternate embodiments can use other material thicknesses.

A floating gate layer 720 is formed over the resonant tunnel barrier 700. The floating gate layer 720, in one embodiment, is silicon. Alternate embodiments can use other materials.

The floating gate layer 720, in one embodiment, is formed to a thickness in the range of 3-6 nm. The floating gate material 720 usually consists of silicon as stated above with a dielectric constant of approximately 12.

A charge blocking layer 721 is formed over the floating gate layer 720. The charge blocking layer 721 prevents the leakage of the charge from the floating gate 720 to the gate 723. In one embodiment, the blocking layer 721 is comprised of HfSiON or $LaAlO_3$ and is formed to a thickness in the range of 5-10 nm. The materials used in the blocking layer 721 may provide an effective oxide thickness of approximately 1 nm.

An ultra-thin layer (e.g., 1-2 nm) of conductive metal nitride 722 may be formed over the charge blocking layer 721 and is comprised of tantalum nitride (TaN), titanium nitride (TiN), or some other metal nitride material. This layer 722 acts as an appropriate passivation layer and diffusion barrier for undesirable impurities and dopants. The passivation layer 722 is not required for proper operation of the memory cell of the present invention.

The gate 723 is formed over the passivation layer 722 or charge blocking layer 721. The gate 723 can be comprised of heavily doped polycrystalline silicon or some other conducting material.

The entire memory cell stack illustrated in FIG. 7, depending on chosen materials, may have an effective oxide thickness again in the range of 5-6 nm. Similar to the illustration of FIG. 6, this one also provides a floating gate memory cell with substantially reduced voltage requirements for programming by nearly a factor of 2.

Figure 8:
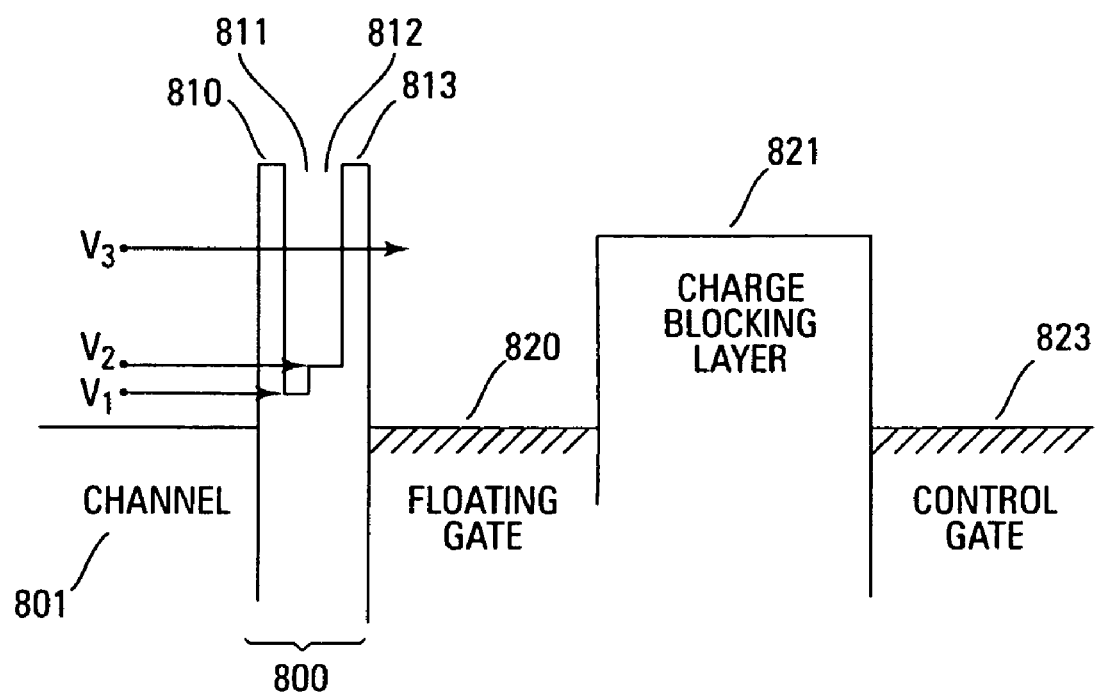
FIG. 8 shows an electron band energy level diagram of the bi-level resonant tunnel barrier transistor of FIG. 7.

FIG. 8 illustrates an electron band energy level diagram of the bi-level resonant tunnel barrier memory cell of FIG. 7. This diagram shows the tunnel barrier 800 energy levels for the first oxide layer 810, the amorphous silicon layer 812, the amorphous germanium layer 811, and the second oxide layer 813. These levels are shown in relation to the channel 801, floating gate 820, charge blocking layer 821, and control gate 823 levels.

The resonant tunnel barrier states are illustrated as $v_1$ and $v_2$. The standard Fowler-Nordheim tunneling state is illustrated as $v_3$. This diagram shows the reduced energy and, therefore, the reduced programming voltages necessary, to tunnel through the resonant tunnel barrier.

Figure 9:
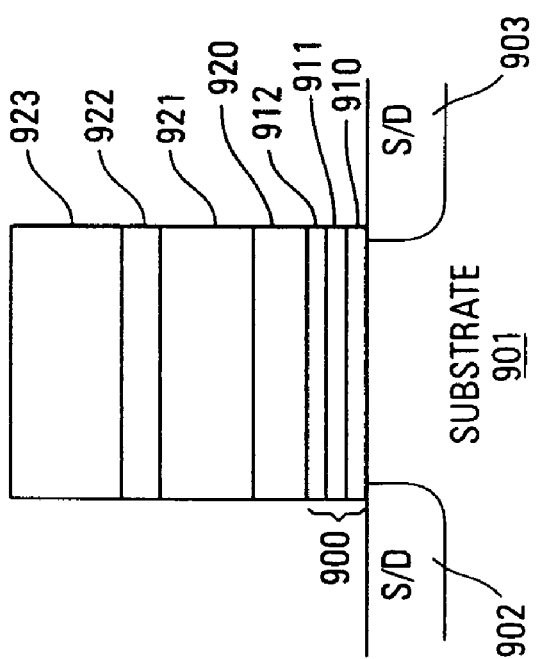
FIG. 9 shows a cross-sectional view of one embodiment of a high-k resonant tunnel barrier transistor of the present invention with an embedded trap layer.

FIG. 9 illustrates a cross-sectional view of one embodiment of an embedded trap memory cell of the present invention using a mono-level resonant tunnel barrier 900. The one transistor cell is formed on a substrate 901 that has doped source/drain areas 902, 903. The function of each active region 902, 903 depends on the direction of biasing of the cell.

The source/drain regions 902, 903 may be n-type regions 902, 903 doped into a p-type substrate 901. In an alternate embodiment, the source/drain regions 902, 903 are p-type regions 902, 903 doped into an n-type substrate 901.

The resonant tunnel barrier 900 is formed over the channel region of the substrate 901 substantially between the pair of source/drain regions 902, 903. The tunnel barrier 900 is comprised of a single amorphous silicon layer 911 between two dielectric layers 910, 912. In one embodiment, the dielectric layers 910, 912 are an oxide such as $SiO_2$.

Each of the layers of the resonant tunnel barrier 900 may be formed to a thickness in the range of 1-3 nm. The materials result in a total effective oxide thickness of the barrier 900 of approximately 3.5 nm. Alternate embodiments can use other material thicknesses.

A charge trapping layer 920 is formed over the resonant tunnel barrier 900. The trap layer 920, in one embodiment, is nitride. Alternate embodiments can use other high-k materials.

The trapping layer 920, in one embodiment, is formed to a thickness in the range of 3-6 nm. The choice of charge trapping material yields an effective oxide thickness of approximately 2.5 nm. Alternate embodiments can use other thicknesses and materials that result in alternate effective oxide thicknesses.

A high-k charge blocking layer 921 is formed over the trap layer 920. The charge blocking layer 921 prevents the leakage of the charge from the floating gate 920 to the gate 923. In one embodiment, the blocking layer 921 is comprised of HfSiON or $LaAlO_3$ and is formed to a thickness in the range of 5-10 nm. The materials used in the blocking layer 921 may provide an effective oxide thickness of approximately 1-2 nm. The high-k charge blocking layer 921, when comprised of the above materials, has a dielectric constant approximately in the range of 14-17.

An ultra-thin layer (e.g., 1-2 nm) of conductive metal nitride 922 may be formed over the charge blocking layer 921 and is comprised of tantalum nitride (TaN), titanium nitride (TiN), or some other metal nitride material. This layer 922 acts as an appropriate passivation layer and diffusion barrier for undesirable impurities and dopants. The passivation layer 922 is not required for proper operation of the memory cell of the present invention.

The gate 923 is formed over the passivation layer 922 or charge blocking layer 921. The gate 923 can be comprised of polycrystalline silicon or some other material.

The entire memory cell stack illustrated in FIG. 9, depending on chosen materials, may have an effective oxide thickness in the range of 7-8 nm. Such a thin EOT provides a memory cell with substantially reduced voltage requirements for programming when compared to the device illustrated in the prior art of FIG. 2.

Figure 10:
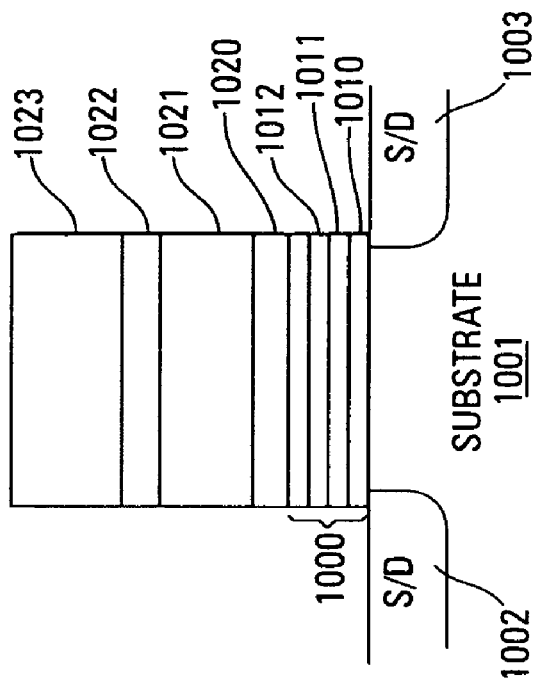
FIG. 10 shows a cross-sectional view of another embodiment of a high-k resonant barrier transistor of the present invention with an embedded trap layer.

FIG. 10 illustrates a cross-sectional view of one embodiment of the memory cell of the present invention using a resonant tunnel barrier 1000. The one transistor cell is formed on a substrate 1001 that has doped source/drain areas 1002, 1003. The function of each active region 1002, 1003 depends on the direction of biasing of the cell.

The source/drain regions 1002, 1003 may be n-type regions 1002, 1003 doped into a p-type substrate 1001. In an alternate embodiment, the source/drain regions 1002, 1003 are p-type regions 1002, 1003 doped into an n-type substrate 1001.

The resonant tunnel barrier 1000 is formed over the channel region in the substrate 1001 substantially between the pair of source/drain regions 1002, 1003. The resonant tunnel barrier 1000 is comprised of an amorphous layer 1011 of material between two high-k dielectric layers 1010, 1012. In one embodiment, high-k refers to a material that has a dielectric constant greater than $SiO_2$ (i.e., k=3.9).

In one embodiment, the amorphous layer 1011 may be a layer of silicon (a-Si). Alternate embodiments may use germanium (a-Ge) or some other amorphous material. In one embodiment, the amorphous layer 1011 is formed between high-k layers 1010, 1012 of HfSiON or $LaAlO_3$. Alternate embodiments may use other high dielectric constant materials around the amorphous layer 1011.

Each of the layers of the resonant tunnel barrier 1000 may be formed to a thickness in the range of 1-3 nm. The materials result in a total effective oxide thickness of the barrier 1000 of approximately 1.5 nm. Alternate embodiments can use other material thicknesses.

A high-k charge trapping layer 1020 is formed over the resonant tunnel barrier 1000. The high-k charge trapping layer 1020 is comprised of an efficient trapping material such as SiN, AlN, or some other nitride. When comprised of AlN, the trapping layer 1020 has a dielectric constant of approximately 10.

The charge trapping layer 1020, in one embodiment, is formed to a thickness in the range of 3-6 nm. The choice of charge trapping material yields an effective oxide thickness of approximately 2.0 nm. Alternate embodiments can use other thicknesses and materials that result in alternate effective oxide thicknesses.

A charge blocking layer 1021 is formed over the charge trapping layer 1020. The charge blocking layer 1021 prevents the leakage of the charge from the charge trapping layer 1020 to the gate 1023. In one embodiment, the blocking layer 1021 is comprised of HfSiON or $LaAlO_3$ and is formed to a thickness in the range of 5-10 nm. The materials used in the blocking layer 1021 may provide an effective oxide thickness of approximately 1 nm. When comprised of the above-described materials, the high-k charge blocking layer has a dielectric constant of approximately 27.5.

An ultra-thin layer (e.g., 1-2 nm) of conductive metal nitride 1022 may be formed over the charge blocking layer 1021 and is comprised of tantalum nitride (TaN), titanium nitride (TiN), or some other metal nitride material. This layer 1022 acts as an appropriate passivation layer and diffusion barrier for undesirable impurities and dopants. The passivation layer 1022 is not required for proper operation of the memory cell of the present invention.

The gate 1023 is formed over the passivation layer 1022 or charge blocking layer 1021. The gate 1023 can be comprised of polycrystalline silicon or some other material.

The entire memory cell stack illustrated in FIG. 10, depending on chosen materials, may have an effective oxide thickness in the range of 4-5 nm. This illustration provides a memory cell that can be programmed at a reduced voltage level of one-third (factor of 3) when compared with the device of FIG. 2.

Figure 11:
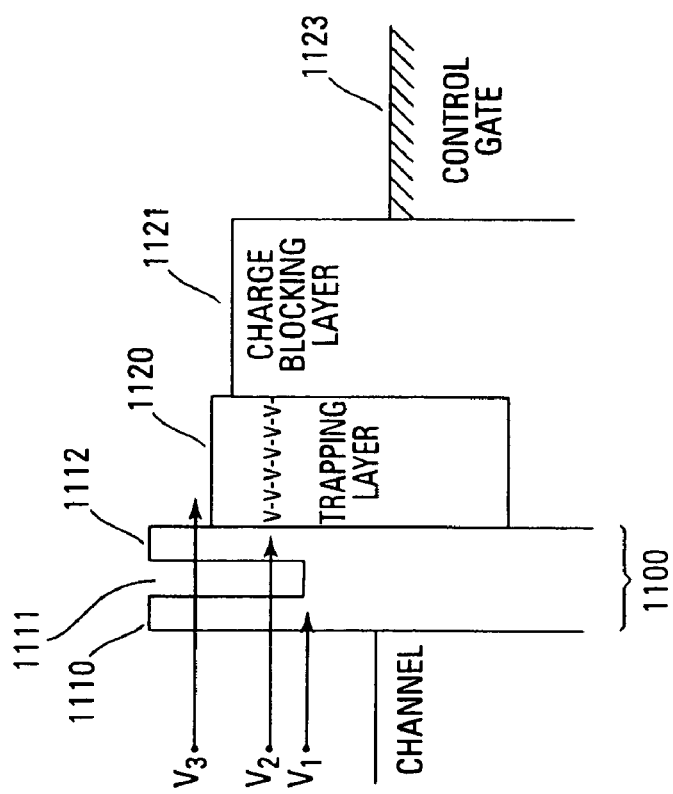
FIG. 11 shows an electron band energy level diagram in accordance with the structure of FIG. 9.

FIG. 11 illustrates an electron band energy level diagram for the resonant tunnel barrier transistor embodiment of FIG. 9. This diagram shows the required energy levels for the tunnel barrier 1100 in relation to the trapping layer 1120, charge blocking layer 1121, and control gate 1123. The tunnel barrier 1100 is further comprised of the three layers 1110-1112.

The resonant tunnel barrier states are illustrated as $v_1$ and $v_2$. The standard Fowler-Nordheim tunneling state is illustrated as $v_3$. This diagram shows the reduced energy and, therefore, the reduced programming voltages necessary, to tunnel through the resonant tunnel barrier.

Figure 12:
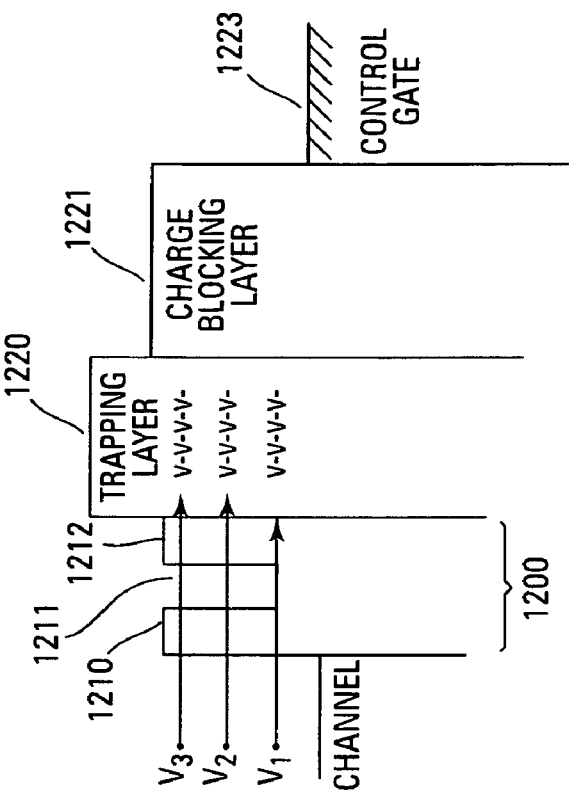
FIG. 12 shows an electron band energy level diagram in accordance with the structure of FIG. 10.

FIG. 12 illustrates an electron band energy level diagram for the resonant tunnel barrier transistor embodiment of FIG. 10. This diagram shows the required energy levels for the tunnel barrier 1200 in relation to the trapping layer 1220, charge blocking layer 1221, and control gate 1223. The tunnel barrier 1200 is further comprised of the three layers 1210-1212.

The resonant tunnel barrier states are illustrated as $v_1$ and $v_2$. The standard Fowler-Nordheim tunneling state is illustrated as $v_3$. This diagram shows further reduction in energy levels and, therefore, the significantly reduced programming voltages necessary to tunnel through the resonant tunnel barrier for such a device.

Figure 13:
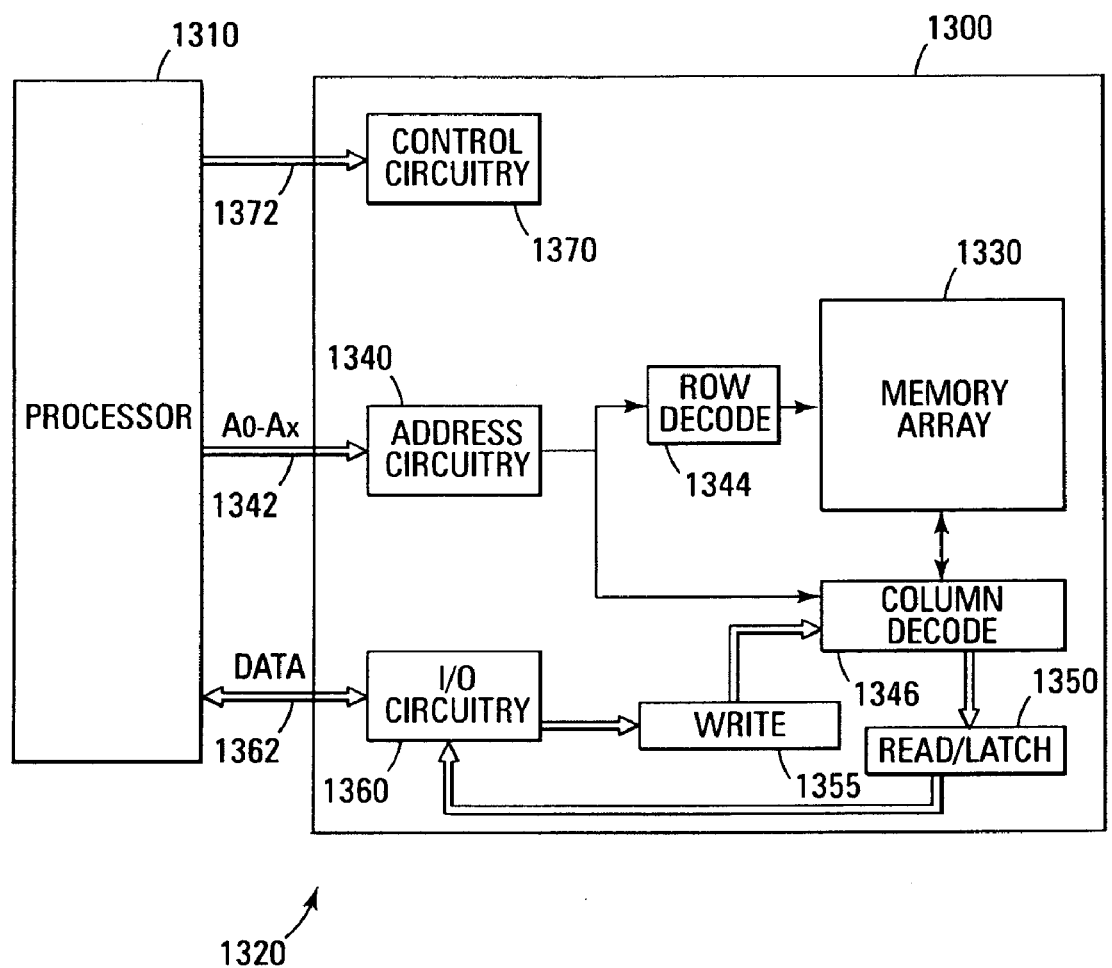
FIG. 13 shows a block diagram of one embodiment of a chip architecture of a memory device and memory system of the present invention.

FIG. 13 illustrates a functional block diagram of a memory device 1300 and memory system 1320 of one embodiment of the present invention. The system has a processor 1310 or other controlling circuitry, for generating memory signals, that is coupled to the memory device 1300. The memory device 1300 has been simplified to focus on features of the memory that are helpful in understanding the present invention.

The memory device includes an array of non-volatile memory cells 1330 as discussed previously with reference to FIG. 1. The memory cells may be flash cells or some other non-volatile memory technology. The memory array 1330 is arranged in banks of rows and columns along word lines and bit lines, respectively. The array may be formed in a NAND architecture, a NOR architecture, or some other array architecture.

An address buffer circuit 1340 is provided to latch address signals provided on address input connections A0-Ax 1342. Address signals are received and decoded by a row decoder 1344 and a column decoder 1346 to access the memory array 1330. It will be appreciated by those skilled in the art, with the benefit of the present description, that the number of address input connections depends on the density and architecture of the memory array 1330. That is, the number of addresses increases with both increased memory cell counts and increased bank and block counts.

The memory device 1300 reads data in the memory array 1330 by sensing voltage or current changes in the memory array columns using sense/latch circuitry 1350. The sense/latch circuitry, in one embodiment, is coupled to read and latch a row of data from the memory array 1330. Data input and output buffer circuitry 1360 is included for bi-directional data communication over a plurality of data connections 1362 with the controller 1310. Write circuitry 1355 is provided to write data to the memory array.

Control circuitry 1370 decodes signals provided on control connections 1372 from the processor 1310. These signals are used to control the operations on the memory array 1330, including data read, data write, and erase operations. The control circuitry 1370 may be a state machine, a sequencer, or some other type of controller.

The non-volatile memory device illustrated in FIG. 13 has been simplified to facilitate a basic understanding of the features of the memory. A more detailed understanding of internal circuitry and functions of flash memories are known to those skilled in the art.

Figure 14:
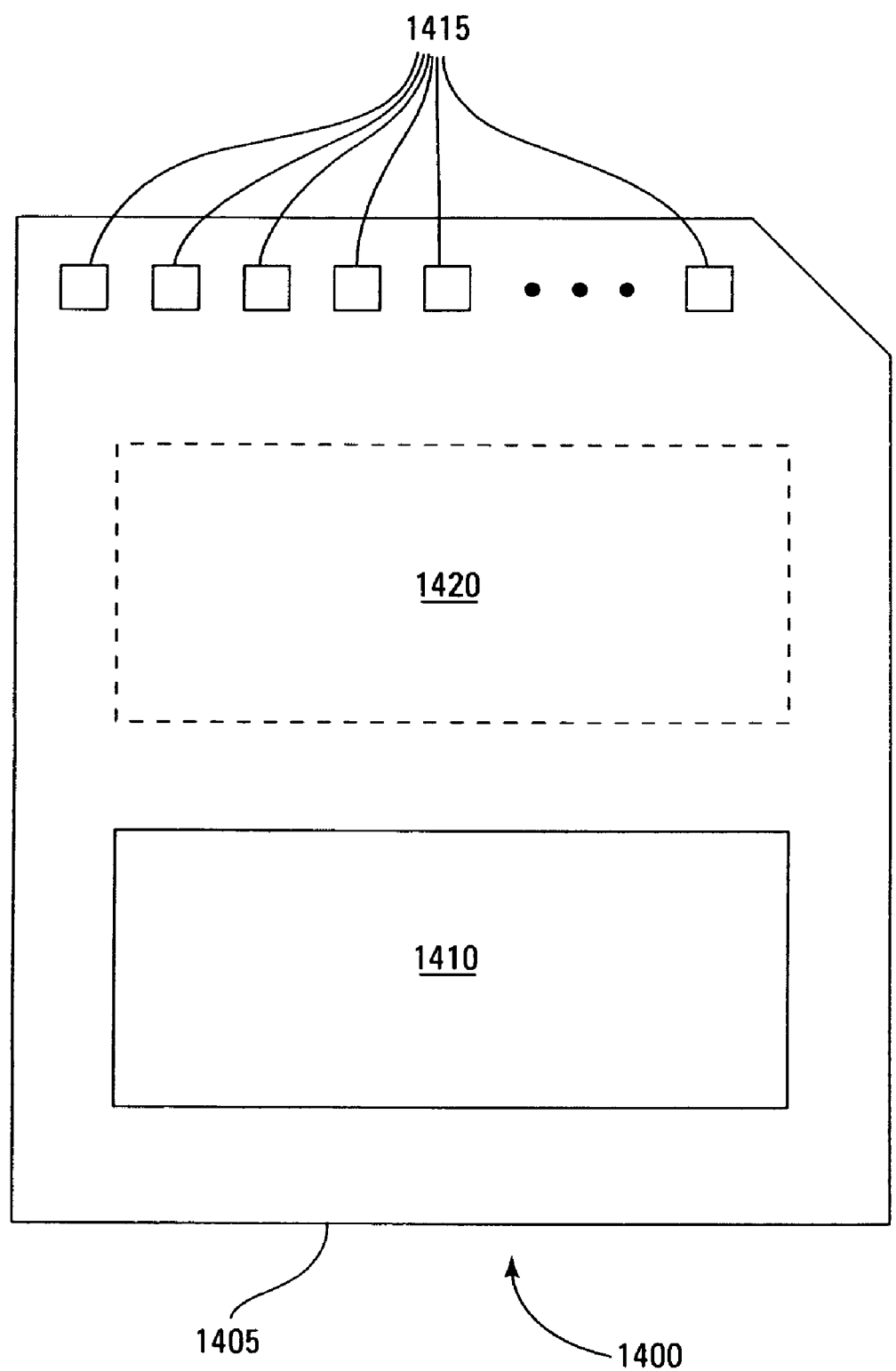
FIG. 14 shows a block diagram of one embodiment of a memory module of the present invention.

FIG. 14 is an illustration of a memory module 1400 that incorporates the memory cell embodiments as discussed previously. Although memory module 1400 is illustrated as a memory card, the concepts discussed with reference to memory module 1400 are applicable to other types of removable or portable memory, e.g., USB flash drives. In addition, although one example form factor is depicted in FIG. 14, these concepts are applicable to other form factors as well.

Memory module 1400 includes a housing 1405 to enclose one or more memory devices 1410 of the present invention. The housing 1405 includes one or more contacts 1415 for communication with a host device. Examples of host devices include digital cameras, digital recording and playback devices, PDAs, personal computers, memory card readers, interface hubs and the like. For some embodiments, the contacts 1415 are in the form of a standardized interface. For example, with a USB flash drive, the contacts 1415 might be in the form of a USB Type-A male connector. For some embodiments, the contacts 1415 are in the form of a semi-proprietary interface, such as might be found on COMPACT-FLASH memory cards licensed by SANDISK Corporation, MEMORY STICK memory cards licensed by SONY Corporation, SD SECURE DIGITAL memory cards licensed by TOSHIBA Corporation and the like. In general, however, contacts 1415 provide an interface for passing control, address and/or data signals between the memory module 1400 and a host having compatible receptors for the contacts 1415.

The memory module 1400 may optionally include additional circuitry 1420. For some embodiments, the additional circuitry 1420 may include a memory controller for controlling access across multiple memory devices 1410 and/or for providing a translation layer between an external host and a memory device 1410. For example, there may not be a one-to-one correspondence between the number of contacts 1415 and a number of I/O connections to the one or more memory devices 1410. Thus, a memory controller could selectively couple an I/O connection (not shown in FIG. 14) of a memory device 1410 to receive the appropriate signal at the appropriate I/O connection at the appropriate time or to provide the appropriate signal at the appropriate contact 1415 at the appropriate time. Similarly, the communication protocol between a host and the memory module 1400 may be different than what is required for access of a memory device 1410. A memory controller could then translate the command sequences received from a host into the appropriate command sequences to achieve the desired access to the memory device 1410. Such translation may further include changes in signal voltage levels in addition to command sequences.

The additional circuitry 1420 may further include functionality unrelated to control of a memory device 1410. The additional circuitry 1420 may include circuitry to restrict read or write access to the memory module 1400, such as password protection, biometrics or the like. The additional circuitry 1420 may include circuitry to indicate a status of the memory module 1400. For example, the additional circuitry 1420 may include functionality to determine whether power is being supplied to the memory module 1400 and whether the memory module 1400 is currently being accessed, and to display an indication of its status, such as a solid light while powered and a flashing light while being accessed. The additional circuitry 1420 may further include passive devices, such as decoupling capacitors to help regulate power requirements within the memory module 1400.

CONCLUSION

In summary, the memory cells of the present invention utilize a resonant tunnel barrier to provide tighter threshold voltage levels and greater voltage scalability. High dielectric constant materials are used in the insulator stack, the charge blocking layer, and the charge trap layer in order to reduce the operating voltages of the cell. A deeper and more efficient trapping layer material similarly reduces the required programming voltages. By taking advantage of high-k material properties, enhanced memory cells with lower operating voltages and enhanced endurance are created as compared to typical prior art SONOS-type and typical prior art resonant tunnel barrier structures.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A non-volatile memory cell comprising
a substrate having a pair of source/drain regions;
a gate insulator stack formed over the substrate and substantially between the pair of source/drain regions, the insulator stack comprising:
a first oxide layer formed over the substrate;
a first amorphous layer of either silicon or germanium formed on and in contact with the first oxide layer;
a second amorphous layer of either germanium or silicon formed on and in contact with the first amorphous layer, wherein the second amorphous layer is different than the first amorphous layer; and
a second oxide layer formed on and in contact with the second amorphous layer;
a high-k charge trapping layer formed over the gate insulator stack;
a high-k charge blocking layer formed over the charge trapping layer; and
a gate formed over the charge blocking layer.

2. The cell of claim 1 wherein the high-k charge trapping layer is comprised of a nitride material and the high-k charge blocking layer is comprised of one of HfSiON or LaAlO$_3$.

3. A non-volatile memory cell comprising
a substrate having a pair of source/drain regions;
a gate insulator stack formed over the substrate and substantially between the pair of source/drain regions, the insulator stack comprising:
a first oxide layer formed over the substrate;

a first amorphous layer of either silicon or germanium formed on and in contact with the first oxide layer;
a second amorphous layer of either germanium or silicon formed on and in contact with the first amorphous layer, wherein the second amorphous layer is different than the first amorphous layer; and
a second oxide layer formed on and in contact with the second amorphous layer;
a floating gate formed over the gate insulator stack;
a high-k charge blocking layer formed over the floating gate; and
a control gate formed over the charge blocking layer.

4. A non-volatile memory cell comprising
a substrate having a pair of source/drain regions;
a gate insulator stack formed over the substrate and substantially between the pair of source/drain regions, the insulator stack comprising:
a first oxide layer formed over the substrate;
a first amorphous layer of either silicon or germanium formed on and in contact with the first oxide layer;
a second amorphous layer of either germanium or silicon formed on and in contact with the first amorphous layer, wherein the second amorphous layer is different than the first amorphous layer; and
a second oxide layer formed on and in contact with the second amorphous layer;
a floating gate formed over the gate insulator stack;
a high-k charge blocking layer comprised of $LaAlO_3$ formed over the floating gate; and
a control gate formed over the charge blocking layer.

5. A non-volatile memory cell comprising
a substrate having a pair of source/drain regions;
a gate insulator stack formed over the substrate and substantially between the pair of source/drain regions, the insulator stack comprising:
a first layer of $LaAlO_3$ formed over the substrate;
a first amorphous layer of either silicon or germanium formed on and in contact with the first layer of $LaAlO_3$;
a second amorphous layer of either germanium or silicon formed on and in contact with the first amorphous layer, wherein the second amorphous layer is different than the first amorphous layer; and
a second layer of $LaAlO_3$ formed on and in contact with the second amorphous layer;
a charge trapping layer formed over the gate insulator stack;
a charge blocking layer formed over the charge trapping layer; and
a gate formed over the charge blocking layer.

6. The cell of claim 5 and further including a passivation layer formed between the charge blocking layer and the gate.

7. The cell of claim 6 wherein the passivation layer is comprised of TaN.

8. The cell of claim 5 wherein the charge trapping layer is comprised of nitride.

9. The cell of claim 5 wherein the charge blocking layer is comprised of either HfSiON or $LaAlO_3$.

10. The cell of claim 5 wherein the charge blocking layer is comprised of a high-k material.

11. A flash memory cell in a silicon substrate, the cell comprising
a pair of source/drain regions doped into the substrate;
a resonant tunnel barrier formed over the substrate and substantially between the pair of source/drain regions, the tunnel barrier comprising:
a first layer of $LaAlO_3$ formed over the substrate;
a first amorphous layer of either silicon or germanium formed on and in contact with the first layer of $LaAlO_3$;
a second amorphous layer of either germanium or silicon formed on and in contact with the first amorphous layer, wherein the second amorphous layer is different than the first amorphous layer; and
a second layer of $LaAlO_3$ formed on and in contact with the second amorphous layer;
a high-k charge trapping layer formed over the resonant tunnel barrier;
a high-k dielectric charge blocking layer formed over the charge trapping layer;
a passivation layer formed over the charge blocking layer; and
a gate formed over the passivation layer.

12. The cell of claim 11 wherein the substrate is a p-type substrate and the source/drain regions are n-type regions.

13. The cell of claim 11 wherein the charge trapping layer is comprised of one of SiN or AlN.

14. A non-volatile memory device comprising:
a memory array having a plurality of non-volatile memory cells formed in a substrate and arranged in a row and column architecture, each memory cell comprising:
a pair of source/drain regions doped into the substrate;
a resonant tunnel barrier formed over the substrate and substantially between the pair of source/drain regions, the resonant tunnel barrier comprising:
a first layer of $LaAlO_3$ formed over the substrate;
a first amorphous layer of either silicon or germanium formed on and in contact with the first layer of $LaAlO_3$;
a second amorphous layer of either germanium or silicon formed on and in contact with the first amorphous layer, wherein the second amorphous layer is different than the first amorphous layer; and
a second layer of $LaAlO_3$ formed on and in contact with the second amorphous layer;
a charge trapping layer formed over the resonant tunnel barrier;
a high-k dielectric charge blocking layer formed over the charge trapping layer;
a passivation layer formed over the charge blocking layer; and
a gate formed over the passivation layer.

15. The device of claim 14 wherein the memory array is arranged in a NAND architecture.

16. The device of claim 14 wherein the memory array is arranged in a NOR architecture.

17. The device of claim 14 wherein the passivation layer is comprised of one of TaN or TiN, the charge trapping layer is comprised of a nitride, and the high-k dielectric charge blocking layer is comprised of one of HfSiON or $LaAlO_3$.

18. A memory system comprising:
a processor that generates control signals; and
a non-volatile memory device coupled to the processor and operating in response to the control signals, the memory device comprising:
a memory array having a plurality of non-volatile memory cells formed in a substrate and arranged in a row and column architecture, each memory cell comprising:
a pair of source/drain regions doped into the substrate;
a resonant tunnel barrier formed over the substrate and substantially between the pair of source/drain regions, the resonant tunnel barrier comprising:
a first layer of $LaAlO_3$ formed over the substrate;

a first amorphous layer of either silicon or germanium formed on and in contact with the first layer of LaAlO$_3$;
a second amorphous layer of either germanium or silicon formed on and in contact with the first amorphous layer, wherein the second amorphous layer is different than the first amorphous layer; and
a second layer of LaAlO$_3$ formed on and in contact with the second amorphous layer;
a high-k charge trapping layer formed over the resonant tunnel barrier;
a high-k dielectric charge blocking layer formed over the charge trapping layer;
a passivation layer formed over the charge blocking layer; and
a gate formed over the passivation layer.

19. The memory system of claim 18 wherein the memory device further includes control circuitry for performing memory operations in response to the processor control signals.

20. The memory system of claim 18 wherein the plurality of non-volatile memory cells of the array are coupled in one of a NAND architecture or a NOR architecture.

21. A memory module comprising:
a memory device comprising:
control circuitry that controls operation of the memory device; and
a memory array coupled to the control circuitry and comprising a plurality of non-volatile memory cells formed in a substrate, each memory cell comprising:
a pair of source/drain regions doped into the substrate;
a resonant tunnel barrier formed over the substrate and substantially between the pair of source/drain regions, the resonant tunnel barrier comprising:
a first layer of LaAlO$_3$ formed over the substrate;
a first amorphous layer of either silicon or germanium formed on and in contact with the first layer of LaAlO$_3$;
a second amorphous layer of either germanium or silicon formed on and in contact with the first amorphous layer, wherein the second amorphous layer is different than the first amorphous layer; and
a second layer of LaAlO$_3$ formed on and in contact with the second amorphous layer;
a high-k charge trapping layer formed over the resonant tunnel barrier;
a high-k dielectric charge blocking layer formed over the charge trapping layer;
a passivation layer formed over the charge blocking layer; and
a gate formed over the passivation layer; and
a plurality of contacts configured to provide selective contact between the memory device and a host system.

22. The module of claim 21 and further including a memory controller coupled to the memory device for controlling operation of the memory device in response to the host system.

23. The module of claim 21 wherein the plurality of non-volatile memory cells are flash memory cells.

* * * * *